(12) United States Patent
Tao et al.

(10) Patent No.: US 11,494,853 B2
(45) Date of Patent: Nov. 8, 2022

(54) METHOD FOR ACQUIRING WATER LEAKAGE AMOUNT OF LEAKAGE AREA IN WATER DISTRIBUTION SYSTEM

(71) Applicant: TONGJI UNIVERSITY, Shanghai (CN)

(72) Inventors: Tao Tao, Shanghai (CN); Jing Ai, Shanghai (CN); Kui Zhang, Shanghai (CN); Hexiang Yan, Shanghai (CN); Kunlun Xin, Shanghai (CN); Shuping Li, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 541 days.

(21) Appl. No.: 16/600,551

(22) Filed: Oct. 13, 2019

(65) Prior Publication Data

US 2020/0319057 A1 Oct. 8, 2020

(30) Foreign Application Priority Data

Apr. 3, 2019 (CN) .......................... 201910266354.3

(51) Int. Cl.
*G06Q 50/06* (2012.01)
*G06F 17/11* (2006.01)
(Continued)

(52) U.S. Cl.
CPC ............. *G06Q 50/06* (2013.01); *G06F 17/11* (2013.01); *G06F 17/16* (2013.01); *G06F 17/18* (2013.01); *G06F 30/20* (2020.01); *G01M 3/2815* (2013.01)

(58) Field of Classification Search
CPC ......... G06Q 50/06; G06F 17/11; G06F 17/16; G06F 17/18; G06F 30/20; G01M 3/2815
See application file for complete search history.

(56) References Cited

U.S. PATENT DOCUMENTS 8,635,051 B1 * 1/2014 Wu .................. G06N 3/126
703/9

FOREIGN PATENT DOCUMENTS

| CN | 102033969 A | | 4/2011 |
|---|---|---|---|
| CN | 102072409 A | * | 5/2011 |
| CN | 107767012 A | | 3/2018 |

(Continued)

OTHER PUBLICATIONS

Adachi et al., "Estimating Area Leakage in Water Networks Based On Hydraulic Model and Asset Information" Procedia Engineering 89 (2014) 278-285 (Year: 2014).*

(Continued)

*Primary Examiner* — John C Kuan

(57) ABSTRACT

The present invention relates to a method for acquiring the water leakage amount of a leakage area in a water distribution system. In the method, a hydraulic model is coupled with monitored data, and the water leakage amounts of different areas in the water distribution system are obtained through inversion by optimizing the spatial distribution of water leakage amounts. In addition to the coupling of the hydraulic model with the monitored data, virtual sectorization and pipe leakage risk assessment are used. By using a minimum difference between a simulated value and a monitored value at a pressure measurement point as a target, the water leakage amounts of different areas in the water distribution system are calculated by an optimization algorithm. Compared with the prior art, the present invention actualizes the effective identification of leakage areas in a water distribution system with a high leakage rate (i.e., with many leakage points).

9 Claims, 2 Drawing Sheets

(51) Int. Cl.
   *G06F 17/16*   (2006.01)
   *G06F 17/18*   (2006.01)
   *G01M 3/28*    (2006.01)
   *G06F 30/20*   (2020.01)

(56) References Cited

FOREIGN PATENT DOCUMENTS

| | | | |
|---|---|---|---|
| CN | 108647470 A | * | 10/2018 |
| CN | 108843977 A | | 11/2018 |
| CN | 105046352 B | | 1/2019 |
| JP | 2016053250 A | * | 4/2016 |

OTHER PUBLICATIONS

Dai, "Simulation, Localization and Control Techniques for Major Leakage Accident of Municipal Water Supply Network" Doctoral dissertation, Tianjin University, 2010 (Year: 2010).*

Ozevin D, Harding J. Novel leak localization in pressurized pipeline networks using acoustic emission and geometric connectivity[J]. International Journal of Pressure Vessels and Piping, 2012, 92: 63-69.

Liggett J A, Chen L C. Inverse transient analysis in pipe networks[J]. Journal of Hydraulic Engineering, 1994, 120(8): 934-955.

Wang X J, Simpson A R, Lambert M F. An analytical solution for the transients in a pipeline with a variable boundary condition: leak detection in pipe networks using coded transients[C]//Water Distribution Systems Analysis Symposium 2006. 2008: 1-10.

Wu Z Y, Sage P. Water loss detection via genetic algorithm optimization-based model calibration[C]//Water Distribution Systems Analysis Symposium 2006. 2008: 1-11.

Soldevila A, Femandez-Canti R M, Blesa J, et al. Leak localization in water distribution networks using Bayesian classifiers[]. Journal of Process Control, 2017, 55: 1-9.

Candelier A, Conti D, Archetti F. Improving analytics in urban water management: a spectral clustering-based approach for leakage localization[J], Procedia—Social and Behavioral Sciences, 2014, 108: 235-248.

Hunaidi O, Chu W, Wang A, et al. Detecting leaks in plastic pipes [J]. Journal-American Water Works Association, 2000, 92(2): 82-94.

* cited by examiner

METHOD FOR ACQUIRING WATER LEAKAGE AMOUNT OF LEAKAGE AREA IN WATER DISTRIBUTION SYSTEM

CROSS-REFERENCE TO RELATED APPLICATIONS

This application claims the benefit of priority from Chinese Patent Application No. CN 201910266354.3, filed on Apr. 3, 2019. The content of the aforementioned application, including any intervening amendments thereto, is incorporated herein by reference in its entirety.

TECHNICAL FIELD

The present invention relates to the technical field of identification of leakage areas in a water distribution system, and in particular to a method for acquiring the water leakage amount of a leakage area in a water distribution system.

BACKGROUND OF THE PRESENT INVENTION

Leakage of the water distribution system results in the loss of water resources and the waste of a large amount of energy, and also poses a threat to the quality of water. In addition, if a pipe with leakage is not repaired in time, the safety of buildings and road traffic may be influenced, and personnel loss and material loss may be caused in severe cases. At present, most water utilities in China still mainly rely on manual leakage detection for leakage control. There is a lack of systematic leakage control schemes and key technologies for leakage identification.

As an important part of the leakage control system of the water distribution system, the leakage identification technology has attracted much attention in the water supply industry. The existing methods include:
 1. Detection Method Using Hardware

REPRESENTATIVE PUBLICATION

[1] Ozevin D, Harding J. Novel leak localization in pressurized pipeline networks using acoustic emission and geometric connectivity [J]. International Journal of Pressure Vessels and Piping, 2012, 92: 63-69.
[2] Hunaidi O, Chu W, Wang A, et al. Detecting leaks in plastic pipes [J]. Journal—American Water Works Association, 2000, 92(2): 82-94.
[3] Hunaidi O, Giamou P. Ground-penetrating radar for detection of leaks in buried plastic water distribution pipes[C]//International Conference on Ground Penetrating Radar. 1998.

Outline: leakage points are accurately identified by means of either acoustic devices or non-acoustic devices. Acoustic detection methods include leakage listening rods, correlators and electronic leakage listening detectors while non-acoustic detection methods include gas injection and ground penetrating radar technology.

Advantages and disadvantages: this method can accurately identify the locations of leakage points, but it is only suitable for small-range leakage detection, high in cost and time-consuming in detection, and cannot actualize leakage detection in time.
 2. Analysis Method Using Software Outline: Based on the basic data such as monitored data and topological information of the water distribution system, leakage identification is actualized by means of algorithms or models.

Advantages and disadvantages: this method is relatively low in cost and can identify leakage in time and determine possible leakage areas, but this method cannot accurately determine the locations of leakage points and is relatively complicated in principle.
 1) Transient-Based Methods

REPRESENTATIVE PUBLICATION

[4] Liggett J A, Chen L C. Inverse transient analysis in pipe networks [J]. Journal of Hydraulic Engineering, 1994, 120(8): 934-955.
[5] Wang X J, Simpson A R, Lambert M F. An analytical solution for the transients in a pipeline with a variable boundary condition: leak detection in pipe networks using coded transients[C]//Water Distribution Systems Analysis Symposium 2006. 2008: 1-10.

Transient-based methods detect leakages based on the analysis of pressure wave generated by transient events or the variation of transient signals.

Advantages:
(1) These approaches can be applied to a wide range of water networks theoretically.
(2) These approaches have high accuracy in leakage detection.

Disadvantages:
(1) These methods require a large number of pressure sensor with high sensitivity and high-frequency sampling abilities deployed in the water networks, which results in high investment.
(2) These methods contain complex computation process.
(3) These methods only have been tested and verified on a laboratory scale and it is hard to apply them to a real water network.
 2) Static hydraulic model-based methods

REPRESENTATIVE PUBLICATION

[6] Perez R, Sanz G, Puig V, et al. A model-based methodology using pressure sensors applied to a real network in Barcelona [J]. IEEE Control Systems Magazine, 2014: 24-36.
[7] Wu Z Y, Sage P. Water loss detection via genetic algorithm optimization-based model calibration[C]//Water Distribution Systems Analysis Symposium 2006. 2008: 1-11.

Static hydraulic model-based methods detect leakages on a basis of establishing the hydraulic model for a certain water network. Leakage scenarios are simulated by setting an emitter to each node. After solving both mass conservation equations and energy conservation equations, compare the similarity of pressure and flow variations between simulated situation and real situation or calibrate the hydraulic model through the optimization of leakage amount distribution, and then leakage detection is achieved.

Advantages:
This type of methods has clear theory support and conducts the leakage detection task by solving basic equations.

Disadvantages:
(1) These approaches rely on accurate hydraulic models but difficulties lying in model parameter estimations such as the friction coefficient estimation have a negative effect on model accuracy. Therefore, it is hard for water company to establish an well calibrated model with high accuracy, which can only be handled by experts.

(2) When applied to model calibration, the optimization method is faced with the problem of large search domain, which causes slow computation.

(3) These approaches depend on data collected from monitoring devices and therefore require certain number of these monitoring devices with certain accuracy.

3) Data-Driven Methods

REPRESENTATIVE PUBLICATION

[8] Soldevila A, Fernandez-Canti R M, Blesa J, et al. Leak localization in water distribution networks using Bayesian classifiers [J]. Journal of Process Control, 2017, 55: 1-9.
[9] Candelieri A, Conti D, Archetti F. Improving analytics in urban water management: a spectral clustering-based approach for leakage localization [J]. Procedia-Social and Behavioral Sciences, 2014, 108: 235-248.

These methods detect leakages by extracting useful information from a large amount of data collected from monitoring devices installed in the network with the concept of statistical analysis or pattern recognition.

Advantages:

These methods do not need any in-depth knowledge about the system and only require data collected from the network to detect leakages using data mining technologies.

Disadvantages:

The main disadvantage of these methods is that a large amount of data is required to develop a data-driven model whereas scarce leakage records can be found in a real water network. How to obtain a data_set with reliability, completeness and perfect labels is the major challenge.

In conclusion, although there have been different types of studies on leakage detection, there is no leakage detection technology widely used by water companies in our country.

SUMMARY OF THE PRESENT INVENTION

An objective of the present invention is to provide a method for acquiring the water leakage amount of a leakage area in a water distribution system in order to overcome the deficiencies in the prior art.

The objective of the present invention may be actualized by the following technical solutions.

A method for acquiring the water leakage amount of an area to be measured in a water distribution system is provided, which includes following steps.

S1: Data of the water distribution system, including a hydraulic model, an actual water leakage amount, a time sequence of monitored values of the free head at pressure measurement points, a leakage risk value of each node and an area to be measured, is input to establish a pipe leakage risk assessment model so as to acquire a leakage risk of each node.

Acquiring a leakage risk of a node includes following specific steps:

11) A pipe leakage risk assessment model is established, and a leakage risk value of each pipe is calculated.

Before the spatial optimization calculation of the water leakage amount, an actual water leakage amount of the water distribution system should be input in advance. The water amount may be calculated by water balance analysis. If it is impossible, the water amount may be estimated by the following formula:

$$Q_l = Q_s \cdot [e-(1\sim2)]\% * (60\%\sim70\%)$$

where $Q_s$ is the total water supply amount of the water distribution system (m³) and e is the production-and-sale difference ratio of the water distribution system (%).

The pipe leakage risk assessment model is expressed by:

$$h(u,Z) = h_0(u)e^{\beta Z}$$

where $h(u,Z)$ is the leakage risk value of the pipe; $h_0(u)$ is a reference risk function for pipe leakage; u is the pipe age; Z is another available factor (i.e., a co-variable) related to pipe leakage, except for the pipe age; and $\beta$ is a coefficient matrix for the co-variable.

12) The leakage risk value of each pipe can be calculated by establishing the pipe leakage risk assessment model; the leakage risk value of each pipe is equally distributed to two endpoints; and the risk values of the endpoints are summed to acquire a leakage risk value k of a node.

Establishing a pipe leakage risk assessment model specifically includes following steps.

111) Pipes in the water distribution system are grouped according to the pipe material and pipe leakage risk assessment models are established for different groups respectively.

112) A leakage frequency is selected as a reference risk function for pipe leakage, and results of calculation are fitted based on pipe repair records and Geographic Information System (GIS) information through a quadratic function to obtain a reference risk function for pipe leakage:

$$h_0(u) = \frac{\sum_{i=1}^{m} \frac{n(u, y_i)}{W(y_i)}}{m}$$

where $n(u,y_i)$ is the number of leakages of a pipe having an age of u within a period of time $y_i$ on a monthly basis; m means the total number of months in the calculated data; and $W(y_i)$ is the total length of pipes within the period of time $y_i$.

113) Together with information about the pipe diameter and pipe age in the pipe repair records, a coefficient matrix p for the co-variable Z is calculated by Cox regression in SPSS.

S2: Indexes of nodes, indices of two endpoints of pipes and pipe lengths are read from the pipe leakage risk assessment model, and pipes are assigned to virtual sectorizations. This includes following specific steps:

21) Based on indexes of nodes, indices of two endpoints of pipes and pipe lengths read in the step S1, a pipe network adjacency matrix, i.e., a weighed graph variable is established; and if there are N nodes and M pipes in the pipe network model, elements in the adjacency matrix A are determined according to the following formula:

$$A_{ab} = \begin{cases} \omega & \text{if node } a \text{ is adjacent to node } b \\ \inf & \text{if node } a \text{ is not adjacent to node } b \end{cases}$$

where a is the index of a node, a=1, 2 ..., N; b is the index of a pipe, b=1, 2 ..., M; and a is the pipe length.

22) Some or all of pressure measurement points input in the step 1 are considered as sectorization centers, and search the shortest path from each node to each sectorization center by a Dijkstra algorithm on the basis of the adjacency matrix A to obtain the shortest path matrix $D_{C \times N}$, where C is the number of sectorization centers.

23) Based on the shortest path matrix $D_{C \times N}$, the minimum value $D_{c,a}$ among elements in the ah column is found, wherein node a belongs to a virtual sectorization containing sectorization center c, where c=1, 2 . . . , C.

S3: A minimum difference between monitored pressure and simulated pressure at the pressure measurement points is selected as a target function, two penalty functions are set, i.e., a minimum free head penalty function and a water leakage amount penalty function, and an optimal spatial distribution of water leakage amounts is searched by a genetic algorithm to acquire water leakage amounts of different areas obtained by the virtual partitioning, so as to instruct the leakage control operation for this area. The final result is the water leakage amount of each area instead of the water leakage amount of a single node.

The minimum difference between monitored pressure and simulated pressure at pressure measurement points selected as a target function is expressed by:

$$\min \Delta p = [\Sigma_{f=1}^{B} \Sigma_{t=1}^{T} |p_{r,f,t} - p_{x,f,t}|] + H_1 + H_2$$

where B is the number of pressure measurement points; T is the simulation duration; $p_{r,f,t}$ is a monitored value of the free head at the pressure measurement point f at moment t; $p_{x,f,t}$ is a simulated value of the free head at the pressure measurement point f at the moment t when an emitter coefficient $g_a = k_a x_a$ of a node is set in the hydraulic model, where $k_a$ is a leakage risk value of the node a and $x_a$ is a value of a decision variable at the node a; and $H_1$ is a minimum free head penalty function. When the emitter coefficient $g_a = k_a x_a$ of a node is set in the hydraulic model, during the simulation period, the minimum value $H_{X,min}$ of the free head simulated at the node should not be less than the minimum free head $H_{min}$ at the most unfavorable point of the water distribution system, where $H_{X,min}$ is determined by the following formula:

$$H_{X,min} = \min(p_{x,a,t})$$

where $p_{x,a,t}$ is the free head simulate datanode at moment when the emitter coefficient $g_a = k_a x_a$ of the node is set in the hydraulic model.

If $H_{min} > H_{X,min}$, then:

$$H_1 = 10 * (H_{min} - H_{X,min});$$

or otherwise, $H_1 = 0$.

$H_2$ is a water leakage amount penalty function. When the emitter coefficient $g_a = k_a x_a$ of a node is set in the hydraulic model, the total water leakage amount $Q_{X,l}$ of the pipe network model should not differ too much from the $Q_l$ input in the step S1, where $Q_{X,l}$ is calculated by the following formula:

$$Q_{X,l} = \Sigma_{a=1}^{N} \Sigma_{t=1}^{T} 3.6 \times k_a x_a p_{x,a,t}^{1.18}.$$

When $|Q_{X,l} - Q_l| / Q_l < L_Q$, $H_2 = 0$; or otherwise, $H_2 = 100 \times |Q_{X,l} - Q_l| / Q_l$, where $L_Q$ is a restriction threshold of the water leakage amount and depends upon the accuracy of $Q_l$.

In the present invention, descendant populations are generated by a genetic algorithm. The generation process includes selection, crossover, mutation and reservation of elite individuals. Three termination conditions are set for searching the optimal spatial distribution of water leakage amounts by the genetic algorithm. The calculation is terminated if any one of the conditions is satisfied.

Condition 1: A limit value F of the target function is obtained. The algorithm terminates when the minimum target function value calculated by the current population is equal to F. It can be known from the formula for calculating the target function that, when F=0, that is, when the emitter coefficient $g_a = k_a x_a$ of the node is set in the hydraulic model, the time sequence of simulated values of the free head at pressure measurement points is completely identical to the time sequence of actual monitored values, and $H_{min} < H_{X,min}$, $|Q_{X,l} - Q_l| / Q_l < L_Q$.

Condition 2: The target function value remains unchanged. The algorithm terminates, when an average relative change in the minimum target function value of 50 successive generations of populations is less than $10^{-6}$.

Condition 3: The maximum number of iterations is reached. The algorithm terminates, when the number of iterations of the algorithm reaches a set maximum iteration number of 500.

Further, after the calculation terminates and the optimal solution is obtained, in the hydraulic model input in the step 1), the emitter coefficient $g_a = k_a x_a$ for each node is set for simulation, the current flow of each water consumption node at each simulation moment is read, and a leakage ratio identification value $R_0$ of each area to be identified is obtained by the following formula:

$$R_0 = \frac{\left[\sum_{t=1}^{T} \sum_{a_c=1}^{N_C} |\hat{q}_{a_c,t} - q_{a_c,t}|\right]}{\left[\sum_{t=1}^{T} \sum_{a=1}^{N} q_{a,t}\right]} \times 100 \%$$

where $N_C$ is the number of water consumption nodes in the virtual area c, $\hat{q}_{a_c,t}$ is the current water consumption amount of the node ac in the virtual area c at the moment t when the emitter coefficient $g_a = k_a x_a$ of the node is set in the hydraulic model, and $q_{a_c,t}$ is the water consumption amount of the node ac in the virtual area c at the moment t.

Compared with the prior art, the present invention has the following advantages.

1. In the present invention, the water leakage amount of a leakage area in a water distribution system is obtained by coupling a hydraulic model with monitored data.

By coupling the hydraulic model of the water distribution system with the actual monitored data and by using virtual partitioning and leakage risk assessment, a minimum difference between simulated values and monitored values at pressure measurement points is selected as a target function, and water leakage amounts of different areas in the water distribution system are calculated by an optimization algorithm, so that leakage areas in the water distribution system are identified. Accordingly, the leakage can be identified in time, and the locations of leakage points can be identified accurately.

2. In the present invention, by considering the pressure measurement points as sectorization centers and the pipe length as a weight, virtual division into areas is realized by searching the shortest path. The virtual sectorization can constrain decision variables of nodes outside the range of pressure monitoring, so that the leakage can be effectively identified and the locations of leakage points can be identified accurately.

3. In the method of the present invention, by using a minimum difference between a simulated value and a monitored value at a pressure measurement point as a target function and setting two penalty functions, i.e., a minimum free head penalty function and a water leakage amount penalty function, an optimal spatial distribution of water leakage amounts is searched by a genetic algorithm, and water leakage amounts of different areas in the water distribution system are calculated. The operation is simple and time-saving, and the method is low in cost and has wide range of application.

4. In the present invention, by the virtual sectorization method, water consumption nodes in the pipe network are grouped. Accordingly, solving over determined equations during the optimization process can be avoided, the search range of the solution space can be narrowed, and the search efficiency can be improved.

DETAILED DESCRIPTION OF THE PRESENT INVENTION

Figure 1:
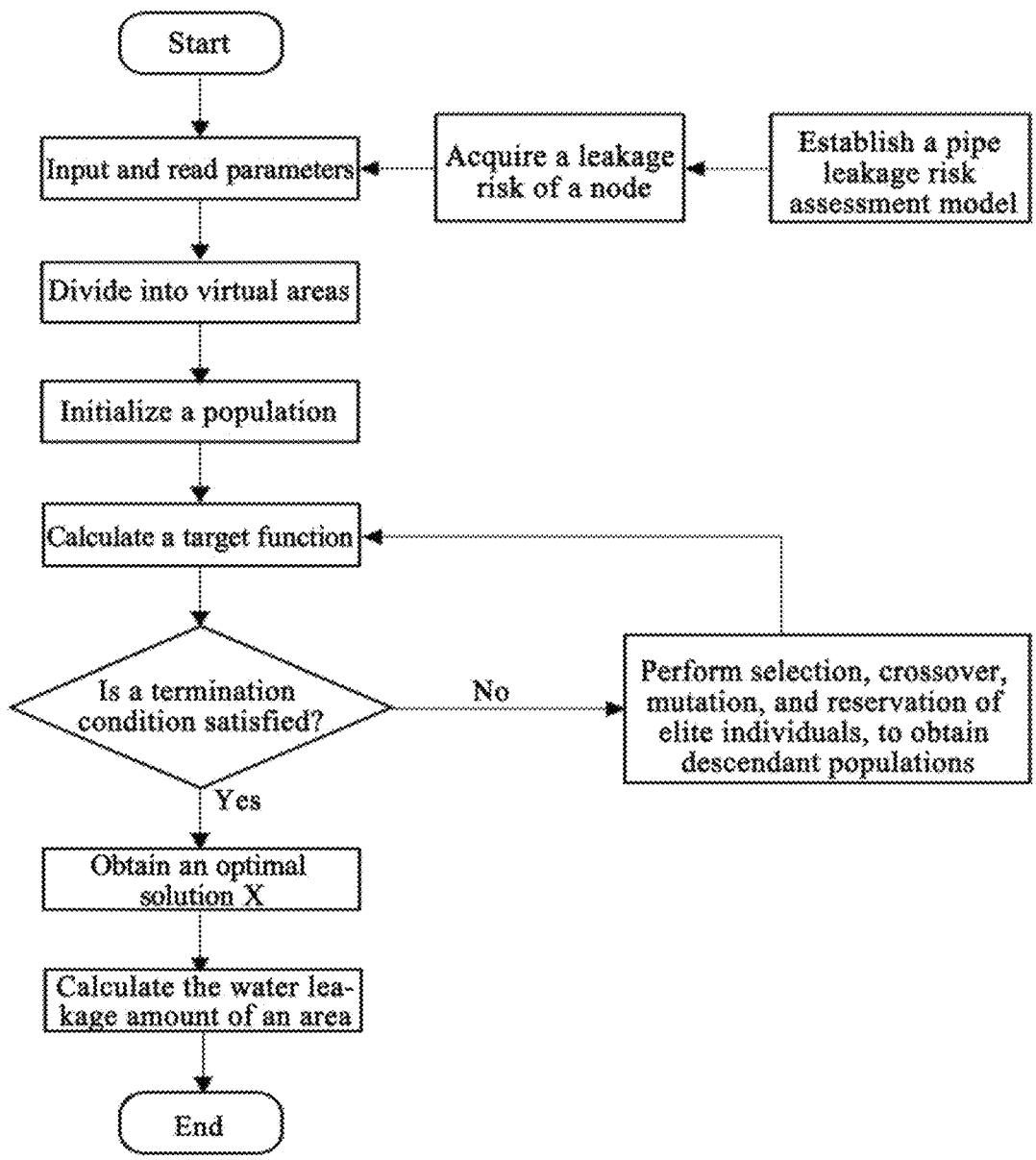
FIG. 1 is a schematic flowchart of the method according to the present invention.
Figure 2:
FIG. 2 is a schematic view showing the pipe network and pressure measurement points according to an embodiment of the present invention.

The present invention will be described below in detail with reference to the accompanying drawings by specific embodiments. Apparently, the embodiments to be described are some but not all of embodiments of the present invention. All other embodiments obtained based on the embodiments in the present invention by a person of ordinary skill in the art without paying any creative effort shall fall into the protection scope of the present invention.

The present invention relates to a method for acquiring the water leakage amount of a leakage area in a water distribution system. The method includes following steps.

Step 1: Data of the water distribution system, including a hydraulic model, an actual water leakage amount, a time sequence of monitored values of the free head at pressure measurement points, a leakage risk value of each node and an area to be measured, is input to establish a pipe leakage risk assessment model so as to acquire a leakage risk of each node. The actual water leakage amount may be calculated by water balance analysis. If it is impossible, the water amount may be estimated by the formula in this method.

Step 2: Sectorization centers are selected and the shortest path is searched by a Dijkstra algorithm on the basis of a weighed graph variable that is established based on the topology of the pipe network and by using the pipe length as a weight, and the pipe is divided into virtual areas.

By using pressure sensors as sectorization centers, and the pipe length as a weight, the shortest path from a node to each sectorization center is searched to realize the division into virtual areas. The virtual partitions can constrain decision variables of nodes outside the range of pressure monitoring.

Step 3: A minimum difference between a monitored value and a simulated value of the pressure at a pressure measurement point is selected as a target function, two penalty functions, i.e., a minimum free head penalty function and a water leakage amount penalty function, are set, and an optimal spatial distribution of water leakage amounts is searched by a genetic algorithm to calculate water leakage amounts of different areas in the water distribution system.

To verify the effectiveness of the method of the present invention, in this case, actual experiments are conducted by taking actual data of the water distribution system in a certain region as an example. The operating process includes following steps.

1. Inputting and Reading Parameters

An inp file of the hydraulic model of the water distribution system in a certain region, which is established by the real-time data and related meter reading data from August 6 in a certain year to August 12 in this year and then get verified, the indices of five pressure measurement points, the time sequence of monitored values of the free head, and the areas to be identified are input.

Information about nodes, water pools, pipes and modes are read from the inp file. Information about nodes includes indices, coordinates, elevations, basic water consumption amounts and water consumption mode indices of nodes. As to water pools, it includes indices, coordinates, average gross heads and water supply mode indices of water pools. Information about pipes contains indices, indices of two endpoints and lengths of pipes. Information about modes consists of indices of modes and the time sequence values.

According to the monitored data, the total water supply amount of this region within this period is about 266015 tons. Together with the production-and-sale difference ratio of this region of about 14.85%, the actual water leakage amount of this region within this period is estimated as 23149.98 $m^3$±9.72%.

Depending upon the pipe material, the pipes in this region are classified into six categories, i.e., galvanized steel pipes, plastic pipes, steel pipes, cast iron pipes, ductile iron pipes and pipes made of other materials. In accordance with the pipe leakage repair records in 2012-2017 and together with the pipe information in the GIS system, a water supply pipe leakage risk assessment model of this region is established by quadratic function fitting and Cox regression, as shown in Table 1.

TABLE 1

Water supply pipe leakage risk assessment model of the region under study

| Pipe material | Pipe leakage risk h(u, d) | Description of parameters |
|---|---|---|
| Galvanized steel | $(0.0004u2 - 0.0089u + 0.141) \times \exp(0.124d)$ | u: pipe age, a; d: pipe diameter value assignment, in following rules: 1-≤DN80; 2-(DN80, DN100]; 3-(DN100, DN110]; 4-(DN110, DN125]; 5-(DN125, DN150]; 6-(DN150, DN400]; 7-(DN400, DN500]; 8-(DN500, DN600]; 9-(DN600, DN700]; 10-(DN700, DN800]; |
| Plastic | $(0.0012u2 - 0.044u + 0.4429) \times \exp(0.151d)$ | |
| Steel | $(0.0002u2 + 0.002u + 0.1166) \times \exp(-0.055d)$ | |
| Cast iron | $(0.0003u2 - 0.0049u + 0.2415) \times \exp(0.05d)$ | |
| ductile iron | $(0.000008u2 - 0.0003u + 0.0107) \times \exp(0.069d)$ | |
| Others | 0 | |

After the leakage risk value of each pipe in the water distribution system of this region is calculated by the model, the leakage risk value of each water consumption node in the model can be obtained.

2. Division into Virtual Areas

After a pipe network adjacency matrix is established based on indexes of nodes, the indices of two endpoints of the pipes and pipe lengths, which are read in the step 1, five pressure measurement points of this region are selected as sectorization centers, and the shortest path is searched by a Dijkstra algorithm, so that a result of area dividing is obtained.

3. Solving an Optimal Solution

By invoking the Matlab Genetic Algorithm Toolbox, population initialization, target function calculation, selection, crossover, mutation, reversion of elite individuals and other operations are executed to search an optimal solution until the calculation satisfies the termination condition, and the optimal solution is then outputted. The selection function is @selectionstochunif; the crossover function is @crossoverscattered, and the crossover probability is set as 0.8; the mutation function is @mutationadaptfeasible; and, the number of elite individuals is set as 2, that is, 2 best individuals in each generation of population will be reserved to a next generation.

4. Calculating the Water Leakage Amount of an Area

By using the optimal solution together with information about the basic water consumption amount of each water consumption node in each area, a leakage ratio of each area to be identified is calculated, as shown in Table 2. Since the age of some pipes in the water distribution system of this region is unknown, the installation date of these pipes is discussed during the calculation of the leakage risk of each node. Although the calculated leakage ratios of areas are slightly different when the value of the installation time of a pipe with unknown age is different, it still can be known by comprehensively considering all results of calculation that the five areas in this region are sorted as A2, A5, A3, A1, A4, by the water leakage amount from the largest to the smallest. This sorting may be used for instructing the leakage control operation in this region.

TABLE 2

The result of identification of the leakage ratio of each area

| Value of the installation time of a pipe with unknown age | | | Leakage ratio of each area (%) | | | | |
|---|---|---|---|---|---|---|---|
| Ductile iron | Galvanized steel | Others | A1 | A2 | A3 | A4 | A5 |
| 1994 | 1970 | 1970 | 0.76 | 4.66 | 0.62 | 0.15 | 1.61 |
| 1994 | 1980 | 1980 | 0.49 | 4.51 | 0.79 | 0.10 | 1.91 |
| 1994 | 1990 | 1990 | 0.00 | 3.92 | 0.86 | 0.21 | 2.80 |
| 1994 | 1999 | 1999 | 0.04 | 3.71 | 1.28 | 0.10 | 2.66 |
| 1994 | 2004 | 2004 | 0.04 | 2.71 | 0.96 | 0.00 | 1.84 |
| Irrespective of the leakage risk of nodes | | | 0.11 | 2.64 | 2.05 | 0.17 | 2.82 |

In the present invention, a hydraulic model is coupled with monitored data to obtain leakage amount of each leakage area in a water distribution system. By coupling the hydraulic model of the water distribution system with the actual monitored data and by using virtual sectorization and leakage risk assessment, a minimum difference between a simulated value and a monitored value at a pressure measurement point is selected as a target function, and water leakage amounts of different areas in the water distribution system are calculated by an optimization algorithm, so that leakage areas in the water distribution system are identified. Accordingly, the leakage can be identified in time, the locations of leakage points can be identified accurately. It is advantageous for instructing the leakage control operation of this region.

The foregoing description merely shows the specific implementations of the present invention, and the protection scope of the present invention is not limited thereto. Various equivalent modifications or replacements can be easily conceived by a person of ordinary skill in the art without departing from the technical scope disclosed by the present invention, and these modifications or replacements shall fall into the protection scope of the present invention. Therefore, the protection scope of the present invention shall be subject to the projection scope defined by the appended claims.

What is claimed is:

1. A method for acquiring a water leakage amount of a leakage area in a water distribution system, which is used for acquiring the water leakage amount of an area to be measured, wherein the method comprises the following steps of:
   1) using pressure sensors to measure a time sequence of monitored values of a free head at pressure measurement points, inputting data of the water distribution system, including a hydraulic model, an actual water leakage amount, a leakage risk value of each of a plurality of nodes and the area to be measured, and establishing a pipe leakage risk assessment model so as to acquire a leakage risk of each of the plurality of nodes;
   2) reading indexes of nodes, indices of two endpoints of pipes of a pipe network and pipe lengths from the pipe leakage risk assessment model, and using the pressure sensors as sectorization centers and searching a shortest path by a Dijkstra algorithm on the basis of a weighted graph variable that is established based on a topology of the pipe network and by using the pipe lengths as weights, and dividing the pipes into virtual areas; and
   3) selecting a target function and setting two penalty functions, i.e., a minimum free head penalty function and a water leakage amount penalty function, and searching an optimal spatial distribution of water leakage amounts to acquire water leakage amounts of different virtual areas.

2. The method for acquiring the water leakage amount of a leakage area in a water distribution system according to claim 1, wherein, in the step 3), a minimum difference between a monitored value and a simulated value of a pressure at a pressure measurement point is selected as a target function.

3. The method for acquiring the water leakage amount of a leakage area in a water distribution system according to claim 2, wherein the optimal spatial distribution of water leakage amounts is searched by a genetic algorithm to acquire the water leakage amounts of different virtual areas.

4. The method for acquiring the water leakage amount of a leakage area in a water distribution system according to claim 1, wherein acquiring a leakage risk of a node comprises following specific steps:
   11) establishing the pipe leakage risk assessment model, and calculating a leakage risk value of each of the pipes, wherein the pipe leakage risk assessment model is expressed by:

$$h(u,Z)=h_0(u)e^{\beta Z}$$

where $h(u,Z)$ is the leakage risk value of a pipe; $h_0(u)$ is a reference risk function for pipe leakage; u is a pipe age; Z is another available factor (i.e., a co-variable) related to pipe leakage, except for the pipe age; and $\beta$ is a coefficient matrix for the co-variable; and 12) equally distributing the leakage risk value of each of the pipes to two endpoints, and summing risk values of the endpoints to acquire a leakage risk value k of a node.

5. The method for acquiring the water leakage amount of a leakage area in a water distribution system according to claim 4, wherein establishing the pipe leakage risk assessment model specifically comprises following steps:
   111) grouping, according to pipe material, pipes in a water distribution system and establishing pipe leakage risk assessment models for different groups, respectively;
   112) using a leakage frequency as the reference risk functions for pipe leakage, and fitting results of calculation based on pipe repair records and Geographic Information System (GIS) information through a quadratic function, to obtain the reference risk function for pipe leakage:

$$h_0(u) = \frac{\sum_{i=1}^{m} \frac{n(u_i, y_i)}{W(y_i)}}{m}$$

where $n(u, y_i)$ is a number of leakages of a pipe having an age of u within a period of time $y_i$ on a monthly basis, m means a total number of months in the calculated data; and $W(y_i)$ is a total length of pipes within the period of time $y_i$;

113) calculating, together with information about a pipe diameter and pipe age in pipe repair records, a coefficient matrix p for the co-variable Z by Cox regression.

6. The method for acquiring the water leakage amount of a leakage area in a water distribution system according to claim 5, wherein dividing the pipes of the pipe network into the virtual areas specifically comprises following steps:

21) establishing, based on the indexes of nodes, the indices of two endpoints of pipes and pipe lengths, which are read in the step 1), a pipe network adjacency matrix, i.e., the weighted graph variable; and if there are N nodes and M pipes in the pipe network model, determining elements in the adjacency matrix A according to the following formula:

$$A_{ab} = \begin{cases} \omega & \text{if node } a \text{ is adjacent to node } b \\ \inf & \text{if node } a \text{ is not adjacent to node } b \end{cases}$$

where a is an index of a node, $a = 1, 2 \ldots, N$; b is an index of a pipe, $b = 1, 2 \ldots, M$; and $\omega$ is a pipe length;

22) by considering some or all of pressure measurement points input in the step 1 as the sectorization centers, on the basis of the adjacency matrix A, searching the shortest path from each of the N nodes to each of the sectorization centers by the Dijkstra algorithm to obtain a shortest path matrix $D_{C \times N}$, where C is a number of the sectorization centers; and 23) based on the shortest path matrix $D_{C \times N}$, finding a minimum value $D_{c,a}$ among elements in the $a^{th}$ column, wherein the node a belongs to a virtual area c containing a respective sectorization center, where $c = 1, 2 \ldots, C$.

7. The method for acquiring the water leakage amount of a leakage area in a water distribution system according to claim 3, wherein the minimum difference between the monitored value and the simulated value at a pressure measurement point selected as the target function is expressed by:

$$\min \Delta p = [\Sigma_{f=1}^{B} \Sigma_{t=1}^{T} |p_{r,f,t} - p_{x,f,t}|] + H_1 + H_2$$

where B is a number of pressure measurement points; T is a simulation duration; $p_{r,f,t}$ is a monitored value of a pressures at the pressure measurement point f at moment t; $p_{x,f,t}$ is a simulated value of the free head at the pressure measurement point f at the moment t when an emitter coefficient $g_a = k_a x_a$ of a node is set in the hydraulic model, where $k_a$ is a leakage risk value of the node a and $x_a$ is a value of a decision variable at the node a; $H_1$ is the minimum free head penalty function; and $H_2$ is the water leakage amount penalty function.

8. The method for acquiring the water leakage amount of a leakage area in a water distribution system according to claim 7, wherein three termination conditions are set for searching the optimal spatial distribution of water leakage amounts by the genetic algorithm, and the searching terminates if any one of the conditions is satisfied:

condition 1: a limit value F of the target function is obtained, and the searching terminates when a minimum target function value calculated by the current population is equal to F;

condition 2: the searching terminates, when an average relative change in a target function value of 50 successive generations of populations is less than $10^{-6}$; and condition 3: the searching terminates, when a number of iterations of the algorithm reaches a set maximum iteration number of 500.

9. The method for acquiring the water leakage amount of a leakage area in a water distribution system according to claim 8, wherein, after the searching terminates and an optimal solution is obtained, in the hydraulic model input in the step 1), the emitter coefficient $g_a = k_a x_a$ for each of the nodes is set for simulation, a current flow of each of a plurality of water consumption nodes at each of a plurality of simulation moments is read, and a leakage ratio identification value $R_0$ of each of the virtual areas to be identified is obtained by the following formula:

$$R_0 = \frac{\left[ \sum_{t=1}^{T} \sum_{a_c=1}^{N_c} |\hat{q}_{a_c,t} - q_{a_c,t}| \right]}{\left[ \sum_{t=1}^{T} \sum_{a=1}^{N} q_{a,t} \right]} \times 100 \%$$

where $N_c$ is a number of water consumption nodes in virtual area c, $\hat{q}_{a_c,t}$ is a current water consumption amount of node ac in the virtual area c at the moment t when the emitter coefficient $g_a = k_a x_a$ of a node is set in the hydraulic model, and $q_{a_c,t}$ is a water consumption amount of the node ac in the virtual area c at the moment t.

\* \* \* \* \*